United States Patent [19]

Grimes et al.

[11] Patent Number: 4,805,140
[45] Date of Patent: Feb. 14, 1989

[54] CROSS-TIE RANDOM ACCESS MEMORY

[75] Inventors: Elizabeth H. Grimes, Ellicott City, Md.; Charles W. Baugh, Severna Park, Pa.

[73] Assignee: Westinghouse Electric Corp., Pittsburgh, Pa.

[21] Appl. No.: 933,709

[22] Filed: Nov. 21, 1986

[51] Int. Cl.$^4$ .............................................. G11C 19/08
[52] U.S. Cl. .................................................... 365/87
[58] Field of Search ......................................... 365/87

[56] References Cited
U.S. PATENT DOCUMENTS 4,473,893  9/1984  Zierhut ................................ 365/87
4,722,073  1/1988  Lampe et al. ........................ 365/87

OTHER PUBLICATIONS

Journal of Applied Physics-53(3); Mar. 1982, pp. 2762-2764.

Primary Examiner—James W. Moffitt
Attorney, Agent, or Firm—W. G. Sutcliff

[57] ABSTRACT

A cross-tie random access memory comprising: a thin film magneto-resistive material having spaced memory locations defining memory elements, the thin film being configured for each memory element to include, when the memory element is in one binary state, a plurality of contiguous magnetic domains, each having a direction extending in the plane of the thin film, each memory element being configured, when the memory element is in the other state, to include a reverse path portion within each of the plurality of magnetic domains having a direction extending in the plane of the film, each path portion being bounded on one side by a Bloch-line and on the opposite side by a cross-tie.

3 Claims, 3 Drawing Sheets

CROSS-TIE RANDOM ACCESS MEMORY

BACKGROUND OF THE INVENTION

The present invention relates to digital memory systems and more particularly to cross-tie memory systems which store data in the form of stable magnetic states.

The dipole magnetic moments of neighboring atoms within a small region, or domain, of a thin film of magnetic material align themselves when placed in an external magnetic field. This alignment of magnetic dipole moments is unique to magnetic materials (Fe, Co, Ni, Gd and Dy), and takes place despite the random motion generally undergone by atoms within any material. The magnetic orientation of the magnetic material remains after the external magnetic field is removed.

Transition regions exist between any two domains which do not have the same alignment of magnetic dipoles. The transition regions between such domains are called domain walls. Different types of domain walls exist, each unique as to the orientation of the magnetization existent within or comprising the domain wall. Within a domain wall referred to as a Neel wall, the magnetization rotates within the plane of the magnetic film. The magnetization in a domain wall referred to as a Bloch-wall rotates out of the plane of the film. Reversing the magnetization direction in a small portion of a Neel wall results in the creation of a third type of domain wall, the cross-tie. The cross-tie magnetization opposes the magnetization in the domains separated by the Neel wall.

Associated with each cross-tie is, as mentioned, a section of reversed or inverted Neel wall; the inverted Neel wall section is bordered by the cross-tie on one end and a Bloch-wall, or a Bloch-line in a very thin film, on the other end.

The characteristic magnetization of the domain wall types remain unchanged in the absence of an external magnetic field of a predetermined strength. In the presence of an external field of such predetermined strength, however, the magnetic state of a domain wall, i.e., the domain state, of the magnetic film at any given location may be changed.

The stable magnetic domain states of the magnetic film represented by the domain wall magnetization directions may be utilized within a random access memory system for the storage of data. Such a memory system is referred to as a "cross-tie" memory system. In a binary cross-tie memory system the stable Neel wall state and the alternative reversed Neel wall with a cross-tie and Bloch-line pair state may be used to represent a bit of data. The data can be written to memory by the application of an appropriate magnetic field. Where a Neel wall exists, a cross-tie Bloch-line pair may be introduced by the application of the appropriate magnetic field. An opposite field may be used to restore the original Neel wall domain state.

The data can also be read from the magnetic memory. The read-out may be accomplished by the use of magneto-resistive effects. While introducing small magnetic fields into the domain walls of the magnetic film, the resistance within the film can be measured. The resistance within the film changes with the introduction of magnetic fields. The precise change in resistance which takes place upon the introduction of magnetic fields varies according to the domain state of the magnetic film. The resistance change is small if the domain state is a Neel wall and, the resistance change is larger if the cross-tie state exits. A measurement of the resistance reveals the state of the domain wall and thus a digit of stored data. The precise amount of the resistance measured in each state and the measured resistance change differs according to which of the known cross-tie memory systems is being practiced.

Reading and writing of individual domains within the magnetic film of such a system is accomplished by means of conductors aligned over positioned domain walls. The currents through the conductors create the small and larger magnetic fields which respectively allow magneto-resistive reading and perform the writing of data.

Although the change in resistance measured when reading is larger for one of the above-mentioned states, the overall resistance change for either state is extremely minute and very difficult to detect, e.g., on the order of 10 to 300 milliohms for the cross-tie state. The minuteness of the resistance change results from the minuteness of the regions containing the domain walls. The thin film material is on the order of 500 Angstroms or less in thickness and the field regions or memory locations are only a few microns wide.

For memory system applications, there is, in addition to the problem of small data signal detection, the problem caused by offset signals which result in a decrease of the signal to noise ratio of the system and the problem caused by non-uniform noise.

Heretofore, various schemes have been proposed for alleviating the read-out problems associated with the minuteness of data signals. For example, alternative domain configurations for increasing the strength of a single field magnetization within each domain location have been proposed to enhance the detection of the change in resistance. Also, methods for improving discrimination between small data signals and potentially larger noise and offset signals have been proposed.

As taught in U.S. Pat. No. 3,868,660, the thin magnetic film may be formed with spaced serrated edges. The serrated-strip configuration provides the means whereby single Neel wall sections occur at predetermined sections along the strip, the occurrence of the domain walls being dependent in part on the width of the strip. U.S. Pat. No. 4,075,612 teaches rounded serrations which put the physical geometry of the strip in substantial alignment with the natural contour of the expected magnetization. The coincidence of the magnetization lines and the geometry of the film permits some enhancement of the magnetization.

Additionally, noise and other system signal irregularities may be partially minimized as against true data signals by the use of various sampling techniques. In U.S. Pat. No. 4,035,629 for example, correlated double sampling may be used. With correlated double sampling, the read signals are differenced from reference signals in two stages of the read sequence thereby correcting incorrect input which results when the value of the data signals is smaller than the value of the non-uniform noise and offsets.

The heretofore proposed structures for dealing with the problem of detecting small signals when reading the stored magnetic domain configurations, while adequate for the purposes intended, have not specifically brought about a multiple enhancement of the magnetic domain configuration within memory locations and hence of the data signals. That is, the heretofore proposed structures either seek to maximize the signal created by a single domain configuration or to discriminate between a small signal and noise or system-matching offset signals. These structures do not attempt to multiply the magnetic domain configurations present at an individual memory location.

SUMMARY OF THE INVENTION

Accordingly, it is an object of the present invention to provide a cross-tie memory which exhibits a substantial, multiple increase in the resistance difference and hence strength of signals when reading the state of a memory element.

Additional objects and advantages of the invention will be set forth in the description which follows, and in part will be obvious from the description or, may be learned by practice of the invention.

To achieve the foregoing objects, and in accordance with the purposes of the invention as embodied and broadly described herein, a cross-tie random access memory is provided comprising: a thin film of magnetoresistive material having a plurality of spaced memory locations along the length thereof, each spaced location defining a single memory element; a plurality of conductor means overlaying the memory locations operative to apply a potential having a selected value and direction to selected memory elements; each memory element being configured to include a plurality of contiguous magnetic domain walls, each having a direction extending in the plane of the thin film at times when the memory element is in one binary state, and a reverse path portion within each of the plurality of magnetic domain walls having a direction extending in the plane of said film, each path portion being bounded on opposite sides by a Bloch-line and a cross-tie when in the other binary state; write means, including the conductor means for applying to selected memory elements a potential having a first predetermined value and selected polarity for changing the binary state of selected memory locations; read means, including said conductor means for applying to the memory elements a potential having a second predetermined value insufficient to change the binary state of the memory elements for sensing a first resistance having a value corresponding to the plurality of contiguous magnetic domain walls in each memory element, at times when the respective memory element is in one binary state, and for sensing a second resistance having a value corresponding to the plurality of Bloch-lines and cross-ties of said plurality of magnetic domain walls in each memory element at times when the respective memory element is in the other binary state.

DESCRIPTION OF THE PREFERRED EMBODIMENT

Figure 1:
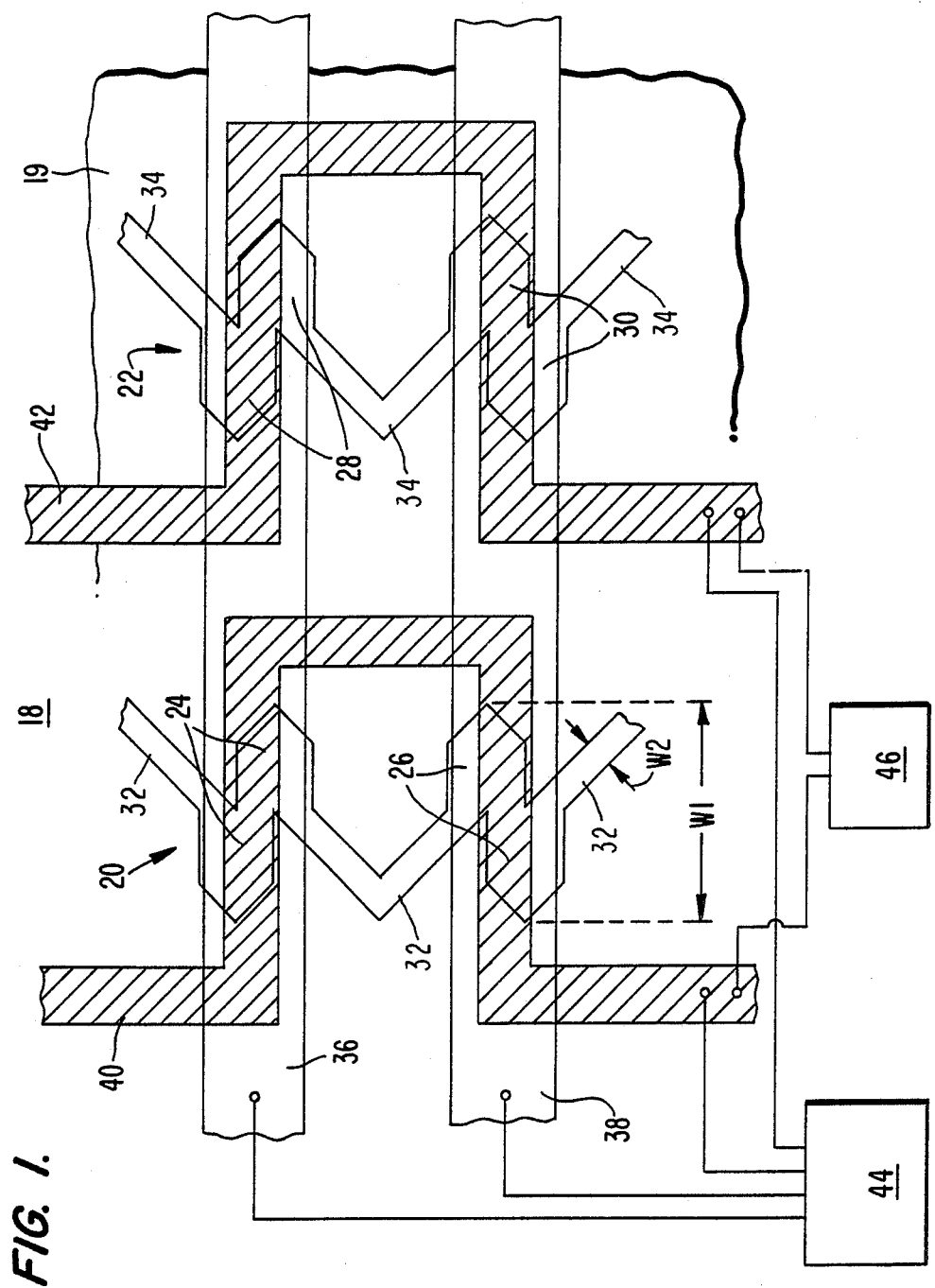
FIG. 1 is an enlarged diagrammatic view of a cross-tie memory system according to the present preferred embodiment of the present invention.

In accordance with the present invention, a cross-tie random access memory comprises a thin film of magnetic resistive material having a plurality of spaced memory locations along the length thereof. As embodied herein, and referring to FIG. 1, cross-tie memory 18 includes a substrate 19 with strips of thin film magnetoresistive material 20, 22 with spaced memory locations 24, 26, 28, 30 contained therein. Thin film 20, 22 preferably has a maximum thickness of approximately 600 Angstroms. Films of greater than 600 Angstroms in thickness require higher switching levels than are desirable, and produce low signal levels, the very object of the present invention being an increase in the level of data signals. The minimum thickness of film 20, 22 is limited by present manufacturing capabilities. The width of thin films 20, 22 preferably does not exceed 40 microns. At points along the film where there are memory locations, the width of the film 20, 22 is the width of memory locations 24, 26, 28, 30 as illustrated by W1. At points along film 20, 22 between memory locations, the width of the film is the width of the connecting portions 32, 34 which connect memory locations This width is represented by dimension W2.

Memory locations 24, 26 or 28, 30 disposed on any strip of thin film 20, 22 respectively, may be pictured as comprising a vertical column of spaced memory locations. Strips of thin film 20, 22 are situated in parallel to form memory array 18.

The present invention includes a plurality of conductor means overlaying the memory locations which are operative to apply a potential having a selected value and direction to selected memory elements. As embodied herein, metallic conductors 36 and 38 overlay memory locations 24, 28, and 26, 30 respectively; while conductors 40 and 42 overlay memory locations 24, 26 and 28, 30 respectively. Conductors 36, 38 may be pictured as running horizontally across several columns of thin strips of magnetic film, such as 20, 22, to overlay a memory location in each of the strips over which the row conductors run. The width of the row conductors 36, 38 is such that the conductors approximately cover a single memory location in each strip. For example, conductor 36 substantially covers memory locations 24 and 28; and conductor 38 substantially covers locations 26 and 30. Column conductors 40, 42 connect memory locations of each strip 20, 22. For example, conductor 40 connects memory locations 24 and 26 of strip 20, and conductor 42 connects locations 28 and 30 of strip 22. As conductors 40 and 42 cross a respective memory location, the conductors cross to cover the widest portion of the location in a horizontal direction as viewed in FIG. 1.

Figure 5:
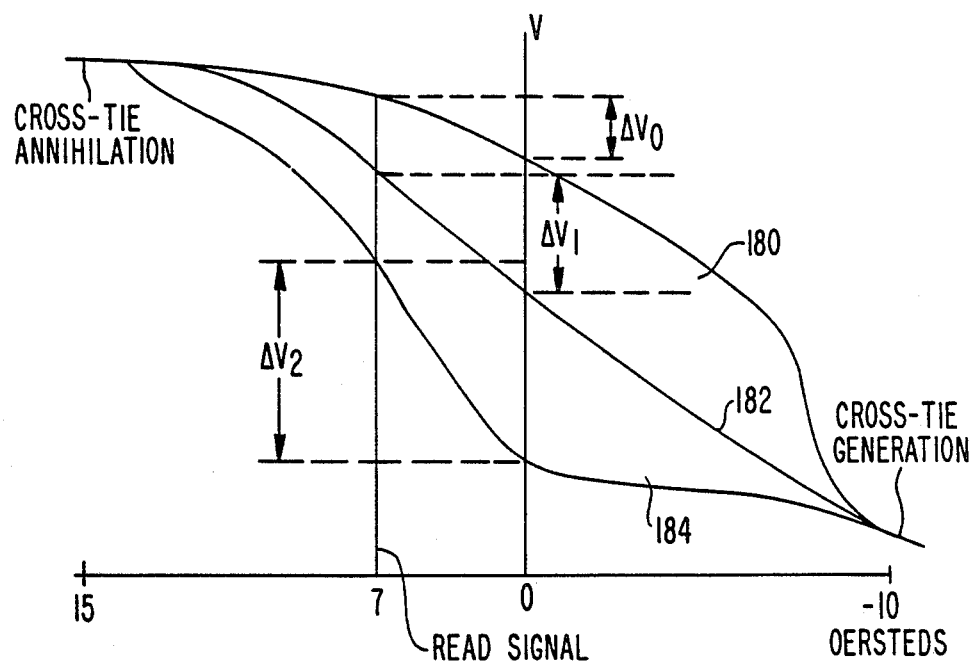
FIG. 5 is a graph illustrating resistance changes between first and second stable states for a single field memory location as contrasted with the resistance changes for the present preferred embodiment.

Write module 44, is connected to both row and column conductors 36, 38, 40 and 42; while read module 46 is connected to column conductors 40, 42. In accordance with the present embodiment, write module 44 and conductors 36, 38, 40 and 42 together comprise a means for writing stable magnetic states into the memory locations. Write module 44 generates a potential of predetermined value and polarity which is applied to a row conductor and a column conductor to place a memory element into the first magnetic state, the Neel wall state For example, write module 44 may generate a potential necessary to generate a magnetic field strength of +15 oersteds as shown in FIG. 5. The memory location written is that location for which both the overlaying column and row conductor have been supplied with the potential of predetermined value. The magnitude of the applied potential is sufficiently large to write a Neel wall state into the specified memory location, but not into the locations where both the overlying row and column conductors have not been coincidently supplied with the predetermined potential. By reversing the polarity of the predetermined potential, a second magnetic state, the cross-tie state may be written. For example, write module 44 may generate a potential necessary to generate a magnetic field strength of −10 oersteds as shown in FIG. 5.

As embodied herein, read module 46, which is attached to row conductors 40, 42, together with column conductors 40, 42 comprise a means for reading the stable states of the memory locations 24, 26, 28, 30. Read module 46 generates a potential having a predetermined value and polarity which is applied to a column conductor to place a memory element in a condition of changed resistance. The applied potential, which may, for example generate a magnetic field strength of +7 oersteds as illustrated in FIG. 5, although sufficient to change the resistance of the memory locations, is insufficient to cause a change in the state of the memory element. The different resistance changes undergone by memory locations in the different states permits a distinction between the stored states at different locations. The resistance charges may be determined using conventional sensing techniques.

In accordance with the present invention, each memory element is configured to include a plurality of contiguous magnetic domain walls, each having a direction extending in the plane of the thin film at times when the memory element is in one binary state, and a reverse path portion within each of the plurality of magnetic domain walls having a direction extending in the plane of the film. Each path portion is bound on opposite sides by the Bloch line and a cross-tie when in the other binary state.

As embodied herein, memory locations as shown in FIG. 1, when written to the cross-tie state, retain two cross-tie Bloch-line pairs. The occurrence of two pairs results from the geometrical configuration of the memory location, which is described in connection with FIG. 2.

In accordance with the present embodiment, two portions 48 and 50 extend laterally in opposite directions from thin film 20 and together form a single polygonally configured memory location exemplified by location 24. Portions 48 and 50 each have first, second, third and fourth external boundaries 52, 54, 56, 58, respectively, with each boundary defining a side. Each portion also has a fifth side represented by dashed lines 60. Fifth side 60 is an imaginary internal boundary common to the two portions 48, 50 over approximately one-half of the length of each fifth side 60. Dashed line 60 is referred to in order to facilitate the description of the invention; and in no way represents an actual physical separation of the portions. Fifth side 60 is offset by approximately one-half the length of the boundary to adjoin connecting portions 32.

Figure 2:
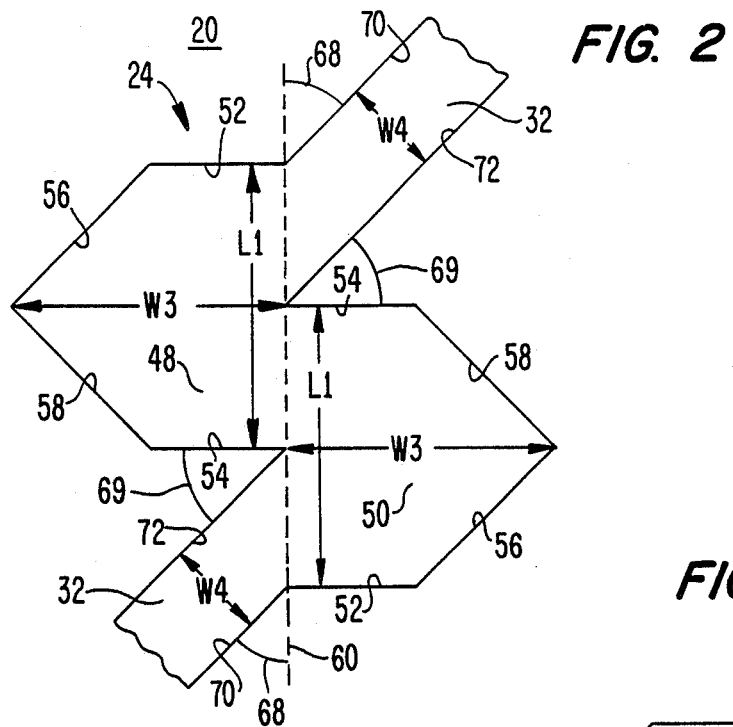
FIG. 2 is a diagrammatic view to illustrate dimensional variables associated with the memory elements in the system of FIG. 1.

The memory location 24 as shown in FIG. 2 is connected by connecting portions 32 to other memory locations as shown in FIG. 1. Each connecting portion 32 has two parallel boundaries 70, 72. At boundary 70, each connecting portion 32 extends at an acute angle 68 from an extension of fifth side 60. At boundary 72, each connecting portion extends at an acute angle 69 to side 54.

First and second spaced boundaries 52 and 54 extend laterally from the boundaries 70 and 72 respectively of the connecting portions. Third and fourth boundaries 56 and 58 of each portion extend from one end of first and second portion boundaries 52 and 54 respectively, and meet to form an apex having an inner angle less than 180°, preferably an angle of approximately 90°.

Fifth side 60 of the portions 48, 50, the imaginary side, connects first and second boundaries 52, 54 at the ends adjoining connecting boundaries 70 and 72 opposite those ends connected to the third and fourth boundaries 56, 58.

In FIG. 2, length L1 of portion 48, 50 of memory location 24 along fifth side 60 is preferably between 5 and 20 microns. Length L1 has an effect on the switching level, i.e. current level required to change a memory location from one stable state to the other. In actual practice, it has been found that the aforesaid length results in switching levels which are not undesirably high, while still ensuring the presence of either of the stable states. The width of each portion represented by W3 from the apex or intersection of third and fourth boundaries 56 and 58 to fifth side 60 is preferably between 5 and 20 microns. This width results in the retention, within the portion, of a stable cross-tie when in the corresponding stable state. Connecting portions 32 are preferably between 1.5 and 7 microns in width as represented by W4. Such a width permits the formation of the desired stable states within each memory location.

Figure 3:
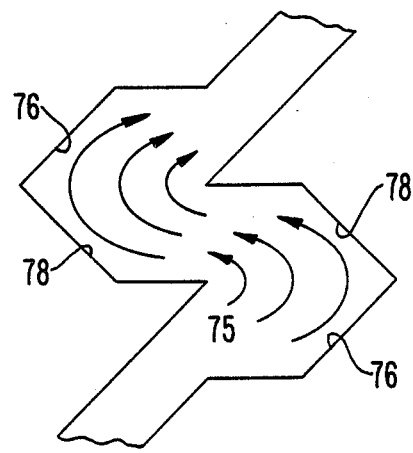
FIG. 3 is an enlarged fragmentary view of a memory element of FIG. 1 illustrating the contiguous magnetic domains when in one stable state.
Figure 4:
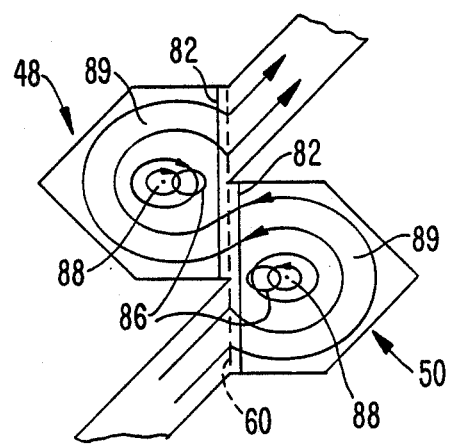
FIG. 4 is an enlarged fragmentary view of a memory element of FIG. 1 illustrating the magnetic domains for the other stable state.

FIGS. 3 and 4 give the magnetization direction for the domains in each of the two polygonal portions of the memory locations. The magnetization direction given in FIG. 3 is for the Neel wall state, and follows the contour of the third and fourth boundaries 76 and 78 in each portion throughout the length of the memory location as shown by lines and arrows 75.

FIG. 4 shows the magnetization direction for the memory locations when in the crosstie state. The magnetization is generally as described above, but portions 48 and 50 each have a Bloch-line 88 located centrally therein; a cross-tie 82 extends along fifth side 60 of each portion. The cross-ties 82 of portions 48 and 50 overlap and are congruent in a manner similar to fifth sides 60. An inverted Neel wall portion 86 is situated between Bloch-line 88 and cross-tie 82. At cross-ties 82, the flux lines break sharply around or away from the Bloch-line 88 as represented by lines and arrows 89. The flux lines break and curve around the Bloch-line 88 when entering the memory location portion and break away from the Bloch-line 88 when leaving the memory location portion.

FIG. 5 illustrates the basic effect, i.e. magneto-resistive effect, relating the resistance changes within memory locations as a function of the magnetic field which is applied when a predetermined potential is applied to conductors overlaying the memory locations. Curve 180 illustrates the change in resistance as a function of the applied field for a Neel wall domain state in a memory location capable of retaining a single cross-tie with the resultant $\Delta V_O$ being the resistance change observed. Curve 182 illustrates the resistance change for the same memory location when the location is in the cross-tie state, wherein the change $\Delta V_1$ is seen to be larger than $\Delta V_O$ observed for the Neel wall state.

Curve 180 also illustrates the change in resistance as a function of the applied field for a memory location such as 24 with two Neel walls capable of retaining two cross-ties with $\Delta V_O$ being the change observed. Curve 184 illustrates the resistance change for memory location 24 in the cross-tie state and thus containing two cross-ties, wherein the change $\Delta V_2$ is seen to be larger than the $\Delta V_O$ observed for the Neel wall state. It is further observed that the change $\Delta V_2$ is significantly larger than the change $\Delta V_1$. The greater difference results in a signal difference between Neel wall only and cross-tie states which is much easier to detect for memory locations such as 24 which are capable of retaining two cross-ties than for single Neel Wall memory locations.

It should be apparent to those skilled in the art that various modifications and variations may be made to the cross-tie memory device of the present invention without departing from the spirit or scope of the invention. Thus, it is intended that the invention cover modifications and variations thereof, provided they come within the scope of the appended claims and their legally entitled equivalents.

What is claimed:

1. A cross-tie random access memory comprising:
   a thin film of magneto-resistive material having a thickness no greater than approximately 600 Angstroms and having a plurality of spaced memory locations along the length thereof, each spaced location defining a single memory element;
   said spaced memory locations being separated by portions of said material defining connecting portions, said connecting portions having a substantially uniform width W4 not less than 1.5 microns and not greater than 7 microns;
   said memory locations each having a polygonal configuration to include two magnetic domains, said two magnetic domains extending laterally from said thin film, each said domain including an apex having an open inner angle, said apex defining the most outward lateral point of said domain, each said domain also including a first side to which said connecting portion adjoins said memory location at opposite ends of said memory location and a second side spaced from and parallel with said first side, said first and second sides of one said domain being spaced opposite said apex of the other domain in said memory location with said second side extending in a direction substantially bisecting the open inner angle, the width W3 from each said apex in each said domain to said first side form which said connecting portion adjoins said domain being between approximately 5 microns and 20 microns, the length L1 from said first side to said second side in each said domain being between approximately 5 microns and 20 microns;
   a plurality of conductor means overlaying said memory elements operative to apply a potential having a selected value and direction to selected memory elements;
   write means, including said conductor means for applying to selected memory elements a potential having a first predetermined value and selected polarity for changing the binary state of selected memory locations; and
   read means, including said conductor means for applying to said memory elements a potential having a second predetermined value insufficient to change the binary state of said memory elements for sensing a first resistance having a value corresponding to said two contiguous magnetic domains in each memory element, at times when the respective memory element is in one binary state, and for sensing a second resistance having a value corresponding to said plurality of Bloch-lines and cross-ties of said two magnetic domains in each memory element at times when the respective memory element is in said other binary state.

2. A cross-tie random access memory according to claim 1 wherein each said open apex has an inner angle of approximately 90°.

3. The cross-tie random access memory, comprising:
   a substrate;
   a thin film of magneto-resistive material having a plurality of spaced memory locations along the length thereof disposed on said substrate, each spaced location defining a single memory element;
   said spaced memory locations being separated by portions of said material defining connecting portions, said connecting portions being of substantial uniform width;
   each said memory location being configured to have at least two portions extending laterally in opposite directions from said thin film, each said portion having first, second, third and fourth and fifth boundaries, each boundary defining a side, said fifth side being an imaginary side common to said portions over a portion of the length of said fifth side said fifth sides being offset lengthwise by approximately one-half of the length of said fifth sides,
   each said connecting portion extending at an acute angle from said fifth side of one of said laterally extending portions along said portion of the fifth side not common to said two portions,
   said first and second boundaries of said portions forming substantially parallel spaced sides extending laterally from said connecting portion boundaries, said third and fourth polygonal portion boundaries extending from said one end of said first and second polygonal portion boundaries respectively and intersecting to form an apex the inner angle of said apex measuring less than 180°,
   said fifth side connecting said first and second boundaries from the other ends of said first and second boundaries.
   a plurality of conductor means overlaying said memory elements operative to apply a potential having a selected value and direction to selected memory elements;
   write means, including said conductor means for applying to selected memory elements a potential having a first predetermined value and selected polarity for changing the binary state of selected memory locations; and
   read means, including said conductor means for applying to said memory elements a potential having a second predetermined value insufficient to change the binary state of said memory elements for sensing a first resistance having a value corresponding to said plurality of contiguous magnetic domains in each memory element, at times when the respective memory element is in one binary state, and for sensing a second resistance having a value corresponding to said plurality of Bloch-lines and cross-ties of said plurality of magnetic domains in each memory element at times when the respective memory element is in said other binary state.

* * * * *